US010557200B2

(12) United States Patent
Ikeda et al.

(10) Patent No.: US 10,557,200 B2
(45) Date of Patent: Feb. 11, 2020

(54) PLASMA PROCESSING DEVICE WITH SHOWER PLATE HAVING PROTRUSION FOR SUPPRESSING FILM FORMATION IN GAS HOLES OF SHOWER PLATE

(71) Applicant: TOKYO ELECTRON LIMITED, Tokyo (JP)

(72) Inventors: Taro Ikeda, Nirasaki (JP); Shigeru Kasai, Nirasaki (JP); Emiko Hara, Nirasaki (JP); Yutaka Fujino, Nirasaki (JP); Yuki Osada, Nirasaki (JP); Jun Nakagomi, Nirasaki (JP); Tomohito Komatsu, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 272 days.

(21) Appl. No.: 14/917,414

(22) PCT Filed: Sep. 4, 2014

(86) PCT No.: PCT/JP2014/073311
§ 371 (c)(1),
(2) Date: Mar. 8, 2016

(87) PCT Pub. No.: WO2015/037508
PCT Pub. Date: Mar. 19, 2015

(65) Prior Publication Data
US 2016/0222516 A1    Aug. 4, 2016

(30) Foreign Application Priority Data

Sep. 11, 2013  (JP) .................................. 2013-188665
Jun. 9, 2014   (JP) .................................. 2014-118531

(51) Int. Cl.
C23C 16/455   (2006.01)
H01J 37/32    (2006.01)
(Continued)

(52) U.S. Cl.
CPC .. *C23C 16/45574* (2013.01); *C23C 16/45565* (2013.01); *C23C 16/511* (2013.01);
(Continued)

(58) Field of Classification Search
CPC ............ H01J 37/3244; H01J 2237/332; C23C 16/45565; C23C 16/511; H01L 21/02211; H01L 21/02274
See application file for complete search history.

(56) References Cited

U.S. PATENT DOCUMENTS 5,807,792 A * 9/1998 Ilg ........................... C23C 16/44
                                                        257/E21.275
7,435,445 B2 * 10/2008 Shin ...................... C23C 16/452
                                                        118/715
(Continued)

FOREIGN PATENT DOCUMENTS

JP    2003-188103 A    7/2003
JP    2005-196994 A    7/2005
(Continued)

OTHER PUBLICATIONS

ISR issued in international application No. PCT/JP2014/073311 dated Dec. 9, 2014.

*Primary Examiner* — Karl Kurple
(74) *Attorney, Agent, or Firm* — Nath, Goldberg & Meyer; Jerald L. Meyer

(57) ABSTRACT

A plasma processing device processes a substrate by generating plasma using a surface wave formed on a surface of a shower plate by a supplied microwave, which includes a plasma generating antenna equipped with the shower plate for supplying first and second gases into a processing vessel, and a drooping member installed to protrude downward from a lower end surface of the shower plate. An outer surface of the drooping member spreads outward as it goes from a top end to a bottom end thereof. The shower plate
(Continued)

includes first and second gas supply holes through which the first and second gases are supplied into the processing vessel, respectively. The first gas supply holes are disposed inward of the outer surface of the drooping member. The second gas supply holes are disposed outward of the outer surface of the drooping member.

6 Claims, 13 Drawing Sheets

(51) Int. Cl.
  *C23C 16/511* (2006.01)
  *B05B 1/00* (2006.01)
  *B05B 1/14* (2006.01)
(52) U.S. Cl.
  CPC .... *H01J 37/3244* (2013.01); *H01J 37/32192* (2013.01); *B05B 1/005* (2013.01); *B05B 1/14* (2013.01); *H01J 2237/332* (2013.01)

(56) References Cited

U.S. PATENT DOCUMENTS

| | | | | |
|---|---|---|---|---|
| 8,336,488 | B2 * | 12/2012 | Chen | C23C 16/36 118/723 I |
| 2004/0149699 | A1 * | 8/2004 | Hofman | H01J 37/32082 219/121.43 |
| 2005/0272247 | A1 * | 12/2005 | Ikeda | H01L 21/28556 438/618 |
| 2006/0228496 | A1 * | 10/2006 | Choi | H01J 37/3244 427/569 |
| 2007/0068625 | A1 * | 3/2007 | Funk | C23C 16/4412 156/345.29 |
| 2007/0163996 | A1 * | 7/2007 | Horiguchi | H01J 37/32192 216/67 |
| 2008/0185104 | A1 * | 8/2008 | Brcka | H01J 37/32357 156/345.29 |
| 2009/0169744 | A1 | 7/2009 | Byun et al. | |
| 2009/0229754 | A1 | 9/2009 | Iizuka et al. | |
| 2010/0055319 | A1 * | 3/2010 | Kato | C23C 16/45544 427/255.28 |
| 2014/0283747 | A1 * | 9/2014 | Kasai | C23C 16/4401 118/723 R |
| 2015/0214013 | A1 * | 7/2015 | Glukhoy | H01J 37/32449 29/527.1 |
| 2015/0222087 | A1 * | 8/2015 | Williams | C23C 16/274 428/64.1 |
| 2016/0222516 | A1 * | 8/2016 | Ikeda | C23C 16/511 |

FOREIGN PATENT DOCUMENTS

| | | |
|---|---|---|
| KR | 1020070091589 A | 9/2007 |
| KR | 10-2013-0081369 A | 7/2013 |
| KR | 1020140115978 A | 10/2014 |
| TW | 200537561 A | 11/2005 |

* cited by examiner

FIG. 15
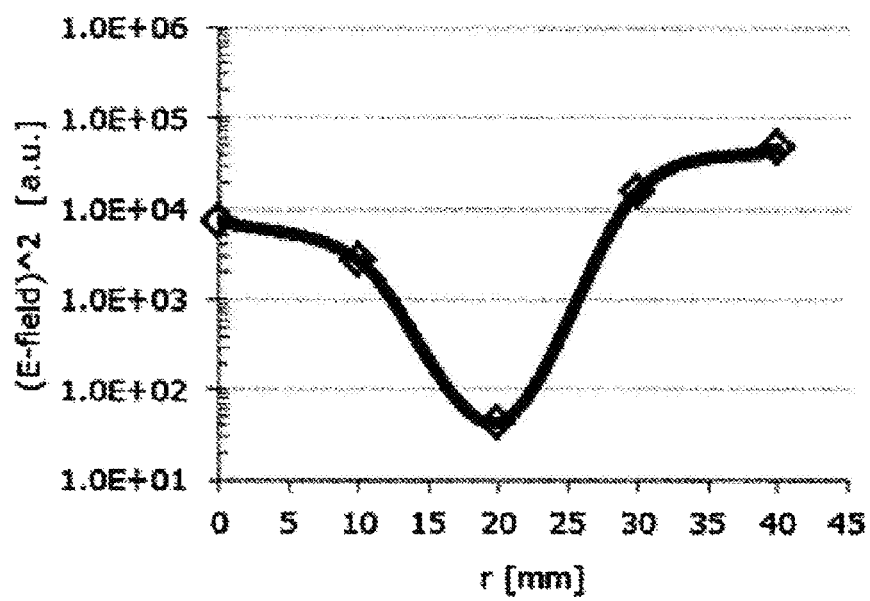
FIG. 16
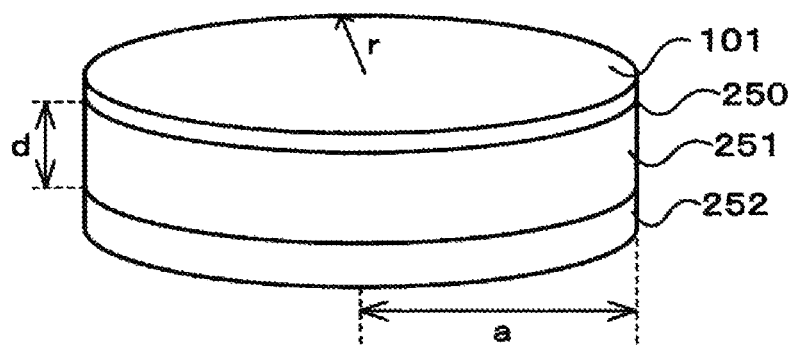
FIG. 17
$$\frac{\partial^2 E_z}{\partial r^2} + \frac{1}{r}\frac{\partial E_z}{\partial r} + \frac{1}{r^2}\frac{\partial^2 E_z}{\partial \theta^2} + \left(k^2 - \beta^2\right)E_z = 0$$

FIG. 18

$$\begin{cases} E_r^d = \dfrac{\alpha\beta}{\beta^2 - k_d^2} J_m'(\alpha r)\cos(m\theta)\left(E_{z0}e^{-j\beta z} + E_{z1}e^{j\beta z}\right)\tan\beta z \\ E_\theta^d = -\dfrac{\beta}{\beta^2 - k_d^2}\dfrac{m}{r} J_m(\alpha r)\sin(m\theta)\left(E_{z0}e^{-j\beta z} + E_{z1}e^{j\beta z}\right)\tan\beta z \\ E_z^d = J_m(\alpha r)\cos(m\theta)\left(E_{z0}e^{-j\beta z} + E_{z1}e^{j\beta z}\right) \\ H_r^d = j\dfrac{1}{\omega\mu}\dfrac{k_d^2}{\beta^2 - k_d^2}\dfrac{m}{r} J_m(\alpha r)\sin(m\theta)\left(E_{z0}e^{-j\beta z} + E_{z1}e^{j\beta z}\right) \\ H_\theta^d = j\dfrac{k_d^2}{\omega\mu\beta}\dfrac{\alpha\beta}{\beta^2 - k_d^2} J_m'(\alpha r)\cos(m\theta)\left(E_{z0}e^{-j\beta z} + E_{z1}e^{j\beta z}\right) \\ H_z = 0 \end{cases}$$

FIG. 19

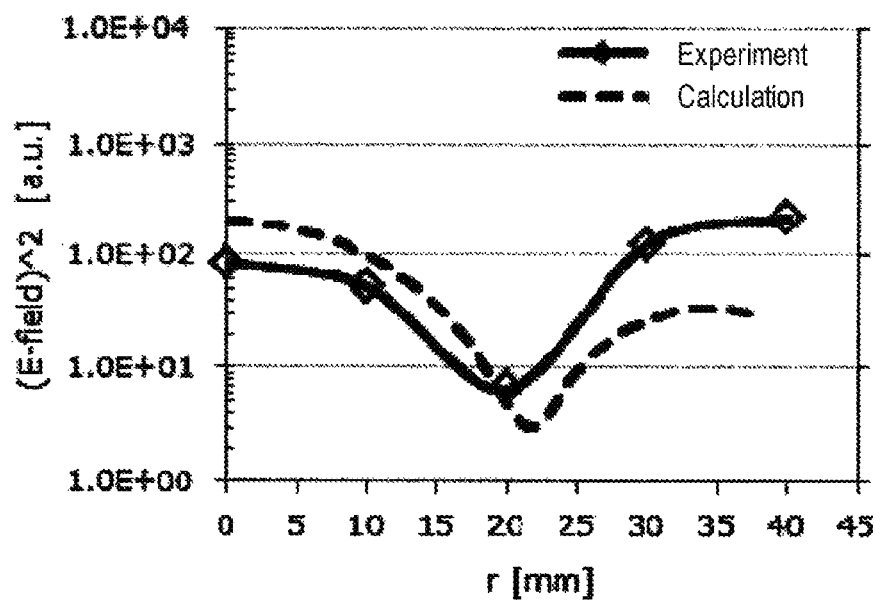

PLASMA PROCESSING DEVICE WITH SHOWER PLATE HAVING PROTRUSION FOR SUPPRESSING FILM FORMATION IN GAS HOLES OF SHOWER PLATE

TECHNICAL FIELD

The present disclosure relates to a plasma processing device including a shower plate for supplying a predetermined gas into a processing vessel.

This application claims priority to Japanese Patent Application No. 2013-188665, filed on Sep. 11, 2013, and Japanese Patent Application No. 2014-118531, filed on Jun. 9, 2014, the entire contents which are incorporated by reference herein.

BACKGROUND

A plasma process is an indispensable technique for manufacturing semiconductor devices. In recent years, further miniaturization of semiconductor devices constituting LSI has been required to meet a demand for high-integration and high-speed of LSI.

However, for a capacitively coupled plasma processing device or an inductivity coupled plasma processing device, an electron temperature of generated plasmas is high, and a region in which a plasma density is high is also limited. For this reason, it is difficult to realize plasma processing according to the requirement of further miniaturization of semiconductor devices.

Therefore, the realization of such miniaturization requires generating plasma with a low electron temperature and a high plasma density. In order to meet this requirement, there is proposed a device for performing a plasma process on a semiconductor wafer (hereinafter, referred to as a "wafer") by generating a surface wave plasma inside a processing vessel using a microwave (see Patent Document 1).

In Patent Document 1, there is proposed a plasma processing device which generates a surface wave plasma having a high plasma density at a low electron temperature by transmitting a microwave through a coaxial tube to radiate the same into a processing vessel and exciting a plasma generation gas using an electric field energy of a surface wave of the microwave.

However, the plasma processing device of Patent Document 1 has a structure in which, in order to irradiate the processing vessel with the microwave through the coaxial tube, a ceiling portion of the processing vessel is configured such that a quartz dielectric plate is inserted between the surface wave plasma and an antenna, and a processing gas is supplied into the processing vessel through a sidewall of the processing vessel. In this way, since the gas is supplied from a portion other than the ceiling portion, the flow of the gas cannot be controlled. As such, a good control of the plasma cannot be achieved.

To address this, in Patent Document 2, there is proposed a technique which installs a shower plate made of a dielectric material, the shower plate having a plurality of gas discharge holes formed in a bottom surface of an antenna, and introduces a processing gas into a processing vessel along a path directed vertically downward from the shower plate. This arrangement forms a vertical gas stream inside the processing vessel and uniformly supplies the processing gas, thereby forming uniform plasma.

PRIOR ART DOCUMENTS

Patent Documents

Patent Document 1: Japanese laid-open publication No. 2003-188103
Patent Document 2: Japanese laid-open publication No. 2005-196994

However, the inventors of the present disclosure found that, if a film formation process is performed on, e.g., a wafer using, e.g., a plasma processing device including the antenna and the shower plate as disclosed in Patent Document 2, films are also formed inside the holes of the shower plate. A, the films formed inside the holes may clog the holes of the shower plate.

From this, it is inferred that this is because an electron temperature of plasma in a region near the shower plate is higher than an electron temperature in a position spaced apart from a surface of the shower plate due to the surface wave plasma. As such, in a film formation process, a raw material gas, such as a monosilane gas ($SiH_4$), is excessively decomposed in the vicinity of the shower plate. As a result, films are deposited in the holes of the shower plate or the raw material gas undergoes a gas phase reaction, thus causing dust.

As a result obtained as the present inventors inspect the clogging, it has been confirmed that the electron temperature is increased particularly in the vicinity of radiation holes (slots) of the microwave formed in the shower plate. For this reason, it is inferred that the majority of the excessive decomposition of the raw material gas is generated in the vicinity of the slots formed in the shower plate.

In order to prevent the excessive decomposition of the raw material gas, the output of the microwave supplied to the antenna is required to be decreased. However, the decrease of the output of the microwave insufficiently excites the plasma generation gas. This fails to stably form plasma. Also, in terms of productivity, it is required to efficiently excite the plasma generation gas and improve a film forming rate in a film formation process, for example.

SUMMARY

Some embodiments of the present disclosure provide a plasma processing device which includes a shower plate configured to introduce a gas into a processing vessel and generates a surface wave plasma using a microwave, thus suppressing a film from being formed in a gas supply hole of the shower plate and efficiently generating plasma.

According to one embodiment of the present disclosure, there is provided a plasma processing device that processes a substrate by generating plasma using a surface wave formed on a surface of a shower plate by a supplied microwave. The plasma processing device includes a plasma generating antenna which is equipped with the shower plate configured to supply a first gas and a second gas into a processing vessel, and a drooping member made of a conductor and installed to protrude downward from a lower end surface of the shower plate. An outer surface of the drooping member spreads outward as it goes from a top end to a bottom end thereof. The shower plate includes a plurality of first gas supply holes through which the first gas is supplied into the processing vessel and a plurality of second gas supply holes through which the second gas is supplied into the processing vessel, wherein the first gas supply holes are disposed inward of the outer surface of the drooping member, and the second gas supply holes are disposed outward of the outer surface of the drooping member.

According to the present disclosure, since the first gas supply holes are disposed inward of the outer surface of the drooping member, the first gas does not pass through a region at which electron temperature is high at an outer circumferential portion of the shower plate. Thus, for example, even if a raw material gas is used as the second gas, it is possible to prevent the raw material gas from being excessively decomposed by a surface wave plasma. As a result, it is possible to suppress a product caused by a reaction production and gas phase reaction from being deposited in gas holes of the shower plate. In addition, since the outer surface of the drooping member spreads outward as it goes from a top end to a bottom end thereof, the microwave is reflected in a lateral direction or an upwardly inclined direction from the outer surface of the drooping member. As a result, an electric field intensity in the vicinity of the outer surface of the drooping member is increased, so that the second gas supplied from the second gas supply holes is efficiently excited to generate plasma.

According to the present disclosure, in a plasma processing device which includes a shower plate configured to introduce a gas into a processing vessel and generates a surface wave plasma using a microwave, it is possible to suppress a product caused by a reaction production and a gas phase reaction from being deposited in the gas holes of the shower plate, and efficiently generate plasma.

BRIEF DESCRIPTION OF THE DRAWINGS

FIG. 15 shows actual measurement values of an electric field intensity distribution in a bottom surface of a drooping member.

FIG. 16 shows a propagation model of a surface wave in the bottom surface of the drooping member.

FIG. 17 shows a Bessel equation representing the surface wave in the bottom surface of the drooping member.

FIG. 18 shows a Bessel function obtained as solutions of the Bessel equation.

FIG. 19 shows theoretical values and actual measurement values of an electric field intensity distribution in the bottom surface of the drooping member.

DETAILED DESCRIPTION

Figure 1:
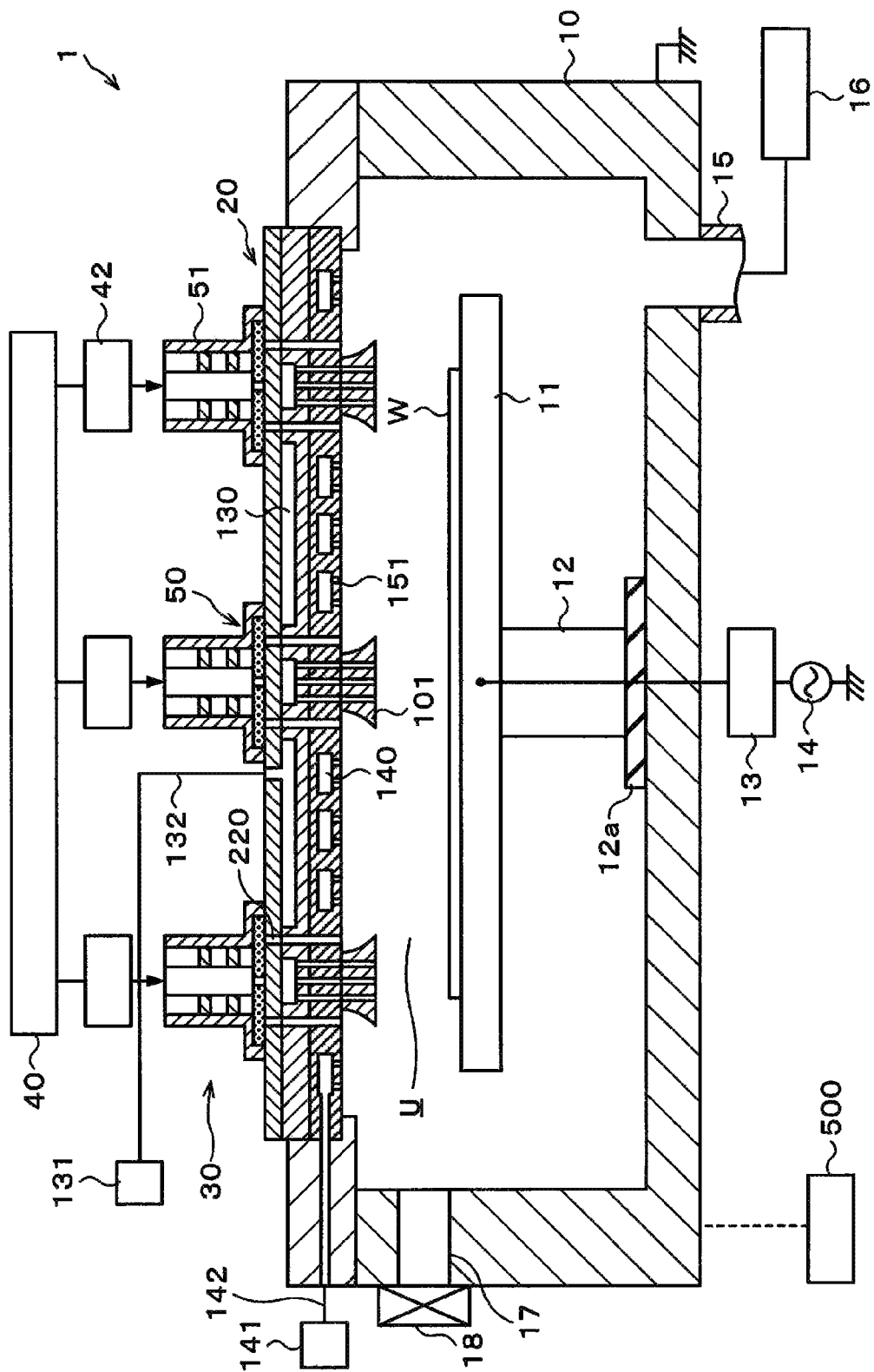
FIG. 1 is a longitudinal sectional view schematically showing a configuration of a plasma processing device according to an embodiment of the present disclosure.

Reference will now be made in detail to various embodiments, examples of which are illustrated in the accompanying drawings. In the specification and drawings, like reference numerals will be assigned to like parts having substantially the same functions and duplicate descriptions thereof will be omitted.

First, the entire configuration of a plasma processing device according to an embodiment of the present disclosure will be described with reference to FIG. 1. FIG. 1 is a longitudinal sectional view schematically showing a plasma processing device 1.

In this embodiment, a CVD device which performs a film formation process as a plasma process on a semiconductor wafer W (hereinafter, referred to as a "wafer W") will be described as an example of the plasma processing device 1. The plasma processing device 1 includes an internally-sealable processing vessel 10 configured to perform the plasma process on the wafer W. The processing vessel 10 is formed in a substantially cylindrical shape having an opened top face, and is made of, for example, a metal such as aluminum. The processing vessel 10 is grounded.

A susceptor 11 for mounting the wafer W thereon is installed at a lower portion of the processing vessel 10. The susceptor 11 is installed at the lower portion of the processing vessel 10 while being supported by a supporting member 12 through an insulator 12a. With this configuration, the susceptor 11 is electrically insulated from the processing vessel 10. An example of a material of the susceptor 11 and the supporting member 12 may include aluminum whose surface is alumite-treated (anodized).

The susceptor 11 is connected to a bias high-frequency power source 14 through a matcher 13. The high-frequency power source 14 applies a bias high-frequency power to the susceptor 11. Thus, ions in plasma are drawn into the wafer W. In addition, although not shown, an electrostatic chuck for electrostatically adsorbing the wafer W, a temperature control mechanism, a gas flow path through which a gas for heat radiation is supplied to a rear surface of the wafer W, lift pins configured to lift up and down to transfer the wafer W, and the like may be installed in the susceptor 11.

An exhaust port 15 is formed in the bottom portion of the processing vessel 10. The exhaust port 15 is connected to an exhaust device 16 equipped with a vacuum pump. The exhaust device 16 is operated to exhaust the inside of the processing vessel 10, thus decompressing the inside of the processing vessel 10 to a predetermined level of vacuum. Also, a loading/unloading port 17 is formed in a sidewall of the processing vessel 10. The wafer W is loaded into and unloaded from the processing vessel 10 with an operation of a gate valve 18 configured to open and close the loading/unloading port 17.

A plasma generating antenna 20 (hereinafter, referred to as an "antenna 20") configured to supply microwaves while supplying a gas into the processing vessel 10 is installed above the susceptor 11. The antenna 20 is arranged to block an upper opening of the processing vessel 10. This forms a plasma space U defined between the susceptor 11 and the antenna 20. A microwave transmitting mechanism 30 for transmitting microwaves therethrough is connected to a top portion of the antenna 20 such that the microwaves output from a microwave output part 40 are transmitted to the antenna 20.

As shown in FIG. 1, a control part 500 is installed in the plasma processing device 1. The control part 500 may be, for example, a computer and includes a program storage part (not shown). The program storage part stores a program for controlling the processing of the wafer W. In addition, the program is stored on a computer-readable storage medium such as a hard disc (HD), a flexible disc (FD), a compact disc (CD), a magnetic optical disc (MO), or a memory card and may be installed in the control part 500 from the storage medium.

Figure 2:
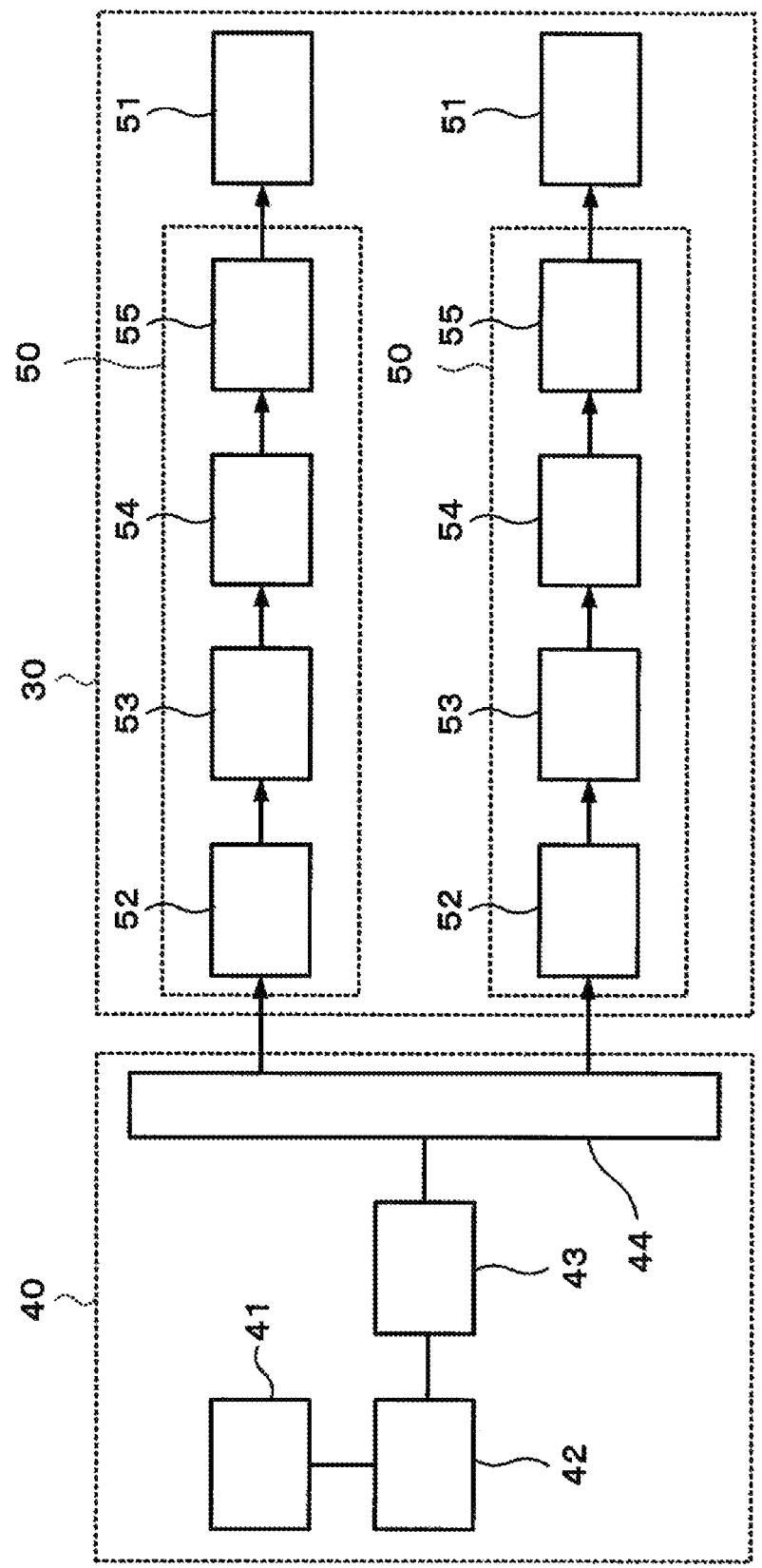
FIG. 2 is a view showing an output-side mechanism of a microwave.

Next, configurations of the microwave output part 40 and the microwave transmitting mechanism 30 will be described with reference to FIG. 2.

The microwave output part 40 includes a microwave power source 41, a microwave oscillator 42, an amplifier 43, and a divider 44 configured to divide amplified microwaves into a plurality of microwaves. The microwave power source 41 supplies power to the microwave oscillator 42. The microwave oscillator 42 oscillates the microwaves having a predetermined frequency of, e.g., 860 MHz, in a phase-locked loop (PLL). The amplifier 43 amplifies the oscillated microwaves. The divider 44 divides the microwaves amplified by the amplifier 43 while performing an impedance matching between input and output sides to prevent loss of the microwaves if possible.

Figure 3:
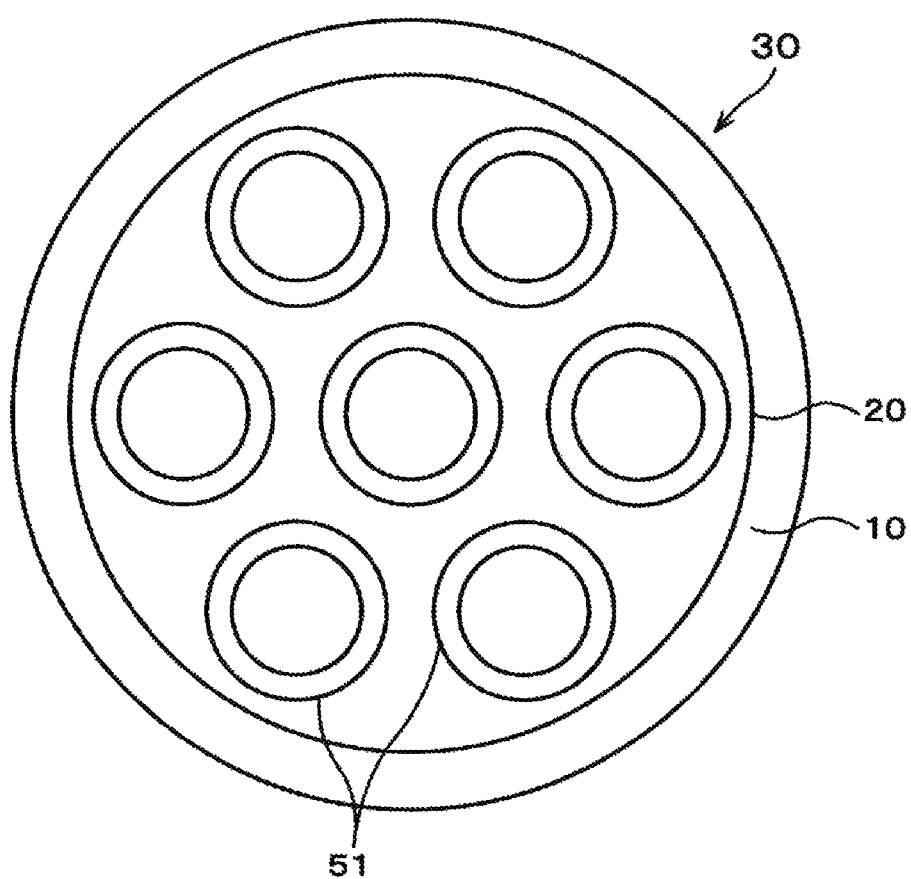
FIG. 3 is a plan view schematically showing a configuration of a microwave transmitting mechanism.

The microwave transmitting mechanism 30 includes a plurality of antenna modules 50 and a plurality of microwave introduction mechanisms 51, which introduce the microwaves divided by the divider 44 into the processing vessel 10. In FIG. 2, the microwave transmitting mechanism 30 is schematically shown to include two antenna modules 50 and two microwave introduction mechanisms 51. However, in this embodiment, for example, as shown in FIG. 3, the microwave transmitting mechanism 30 includes, for example, seven antenna modules 50, wherein six antenna modules 50 are arranged in the same circumferential direction and one antenna module 50 at the center thereof are disposed on the top portion of the antenna 20.

The antenna module 50 includes a phase shifter 52, a variable gain amplifier 53, a main amplifier 54, and an isolator 55 and transmits the microwaves outputted from the microwave output part 40 to the microwave introduction mechanism 51.

The phase shifter 52 is configured to shift and adjust the phase of the microwave, thereby modulating radiation characteristics of the microwave. With this configuration, it is possible to change a plasma distribution by controlling the directivity of the microwave. When the modulation of the radiation characteristics is not required, the phase shifter 52 may be omitted.

The variable gain amplifier 53 adjusts a power level of the microwave to be inputted into the main amplifier 54 so as to adjust a plasma intensity. The main amplifier 54 constitutes a solid state amplifier. The solid state amplifier may include an input matching circuit, a semiconductor amplifying element, an output matching circuit, and a high Q resonant circuit, which are not shown.

The isolator 55 is configured to isolate a reflective wave of the microwave which reflects from the antenna 20 and then returns to the main amplifier 54, and includes a circulator and a dummy load (coaxial terminator). The circulator introduces the microwave reflecting from the antenna 20 into the dummy load. The dummy load converts the reflective wave of the microwave introduced by the circulator into heat.

Figure 4:
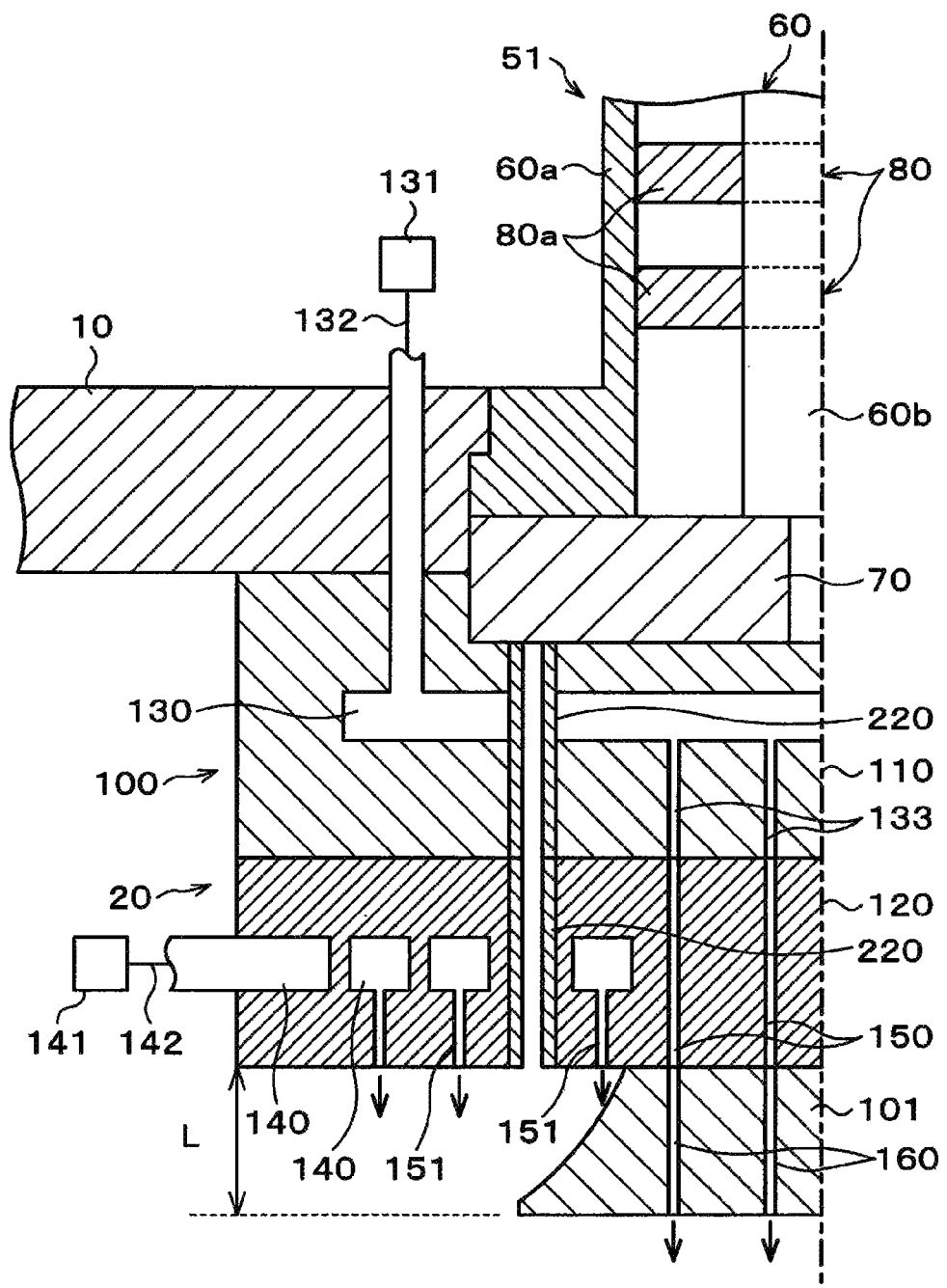
FIG. 4 is an enlarged longitudinal sectional view schematically showing a configuration in the vicinity of a microwave introduction mechanism.

Next, configurations of the microwave introduction mechanism 51 and the plasma generating antenna 20 will be described with reference to FIG. 4. FIG. 4 is an enlarged longitudinal sectional view schematically showing, for example, a left-half configuration of the microwave introduction mechanism 51 and the antenna 20 according to this embodiment.

The microwave introduction mechanism 51 includes a coaxial tube 60 and a slow-wave plate 70. The coaxial tube 60 includes a coaxial waveguide which is constructed of a cylindrical outer conductor 60a and a rod-shaped inner conductor 60b installed in the center of the outer conductor 60a. The antenna 20 is installed at a lower end of the coaxial tube 60 through the slow-wave plate 70. In the coaxial tube 60, the inner conductor 60b is configured as a power supply side, and the outer conductor 60a is configured as a ground side. Tuners 80 are installed in the coaxial tube 60. The tuners 80 include, for example, two slugs 80a, and constitute a slug tuner. Each of the slugs 80a is configured as a plate body of a dielectric member and is formed in a circular ring shape between the inner conductor 60b and the outer conductor 60a of the coaxial tube 60. Based on instructions provided from the control part 500 (which will be described later), the tuners 80 are configured to vertically move the respective slugs 80a with an operation of a driving mechanism (not shown) and adjust impedance of the coaxial tube 60.

The slow-wave plate 70 is installed adjacent to a bottom surface of the coaxial tube 60. The slow-wave plate 70 is formed of a dielectric member having a circular plate shape. The slow-wave plate 70 transmits the microwaves passing through the coaxial tube 60 and guides the same to the antenna 20.

The antenna 20 includes a shower plate 100. The shower plate 100 is installed adjacent to a bottom surface of the slow-wave plate 70. The shower plate 100 has an approximately disc-shape having a larger diameter than that of the slow-wave plate 70 and is formed of a conductor having high electrical conductivity, such as aluminum or copper. A bottom surface of the shower plate 100 is exposed to the plasma space U of the processing vessel 10. A surface wave propagates through the exposed bottom surface. Here, a metal surface of the shower plate 100 is exposed to the plasma space U. Hereinafter, the surface wave propagated through the exposed bottom surface will be referred to as a metal surface wave.

Drooping members 101 (i.e., protrusion members) protruding downward, i.e., toward the plasma space U, are respectively installed at positions corresponding to the bottom surface of the shower plate 100 below the coaxial tube 60. Each of the drooping members 101 has an approximately truncated conical shape with a circular bottom. Like the shower plate 100, the drooping member 101 is formed of a conductor having high electrical conductivity, such as aluminum or copper. An outer surface of the drooping member 101 is formed in, e.g., a shape gradually spreading outward from the top end to the bottom end thereof. That is to say, the outer surface of the drooping member 101 has a parabolic shape in which a contact point of the shower plate 100 and the outer surface of the drooping member 101 is set as the origin.

The shower plate 100 has a structure in which an approximately disc-shaped upper plate 110 is vertically overlapped with an approximately disc-shaped lower plate 120. The upper plate 110 includes a gas flow path 130 formed to penetrate through the top surface thereof and through which a gas flows in a diameter direction of the upper plate 110. The gas flow path 130 is coupled to a first gas supply source 131 configured to supply a first gas through a supply pipe 132. The first gas may include plural kinds of gases or be a mixed gas thereof. The first gas may be, for example, monosilane gas ($SiH_4$) as a raw material gas. A plurality of first gas supply holes 133 in communication with the gas flow path 130 is formed to extend vertically upward at positions in the lower portion of the upper plate 110 and inward of the outer surface of the drooping member 101. A plurality of slots 220 used as microwave radiation holes through which microwaves pass is formed at positions different from those of the first gas supply holes 133. In some embodiments, the shape of each of the drooping members 101 and the arrangement of each of the slots 220 may be set such that an imaginary line drawn vertically downward from the center of the slot 220 intersects the outer surface of the drooping member 101. In other words, as viewed from the top, each of the slots 220 may be arranged such that the center thereof is positioned inward of an outer circumferential end of the bottom surface of the drooping member 101.

Through-holes 150 vertically penetrating through the lower plate 120 are formed at positions corresponding to the first gas supply holes 133 in the lower plate 120, respectively. With such a configuration, the first gases passing through the first gas supply holes 133 can reach a lower end surface of the lower plate 120 through the through-holes 150, respectively. Like the upper plate 110, slots 220 are respectively formed at positions corresponding to the slots 220 of the upper plate 110 in the lower plate 120.

Through-holes 160 extending from an upper end surface of the drooping member 101 to a lower end surface thereof is formed at positions corresponding to the lower ends of the through-holes 150 in the drooping member 101, respectively. Also, the drooping member 101 is installed to protrude vertically downward by a predetermined length L from the lower end of the shower plate 120. Thus, the first gas supplied to the gas flow path 130 from the first gas supply source 131 is introduced into the plasma space U of the processing vessel 10 from positions spaced apart by the predetermined length L from the lower plate 120, through the plurality of through-holes 160.

In addition, a gas flow path 140 which is formed to penetrate through a lateral surface of the lower plate 120 and through which a gas flows in the diameter direction of the lower plate 120, is formed in the lower plate 120. The gas flow path 14 is coupled to a second gas supply source 141 configured to supply a second gas through a supply pipe 142. An example of the second gas may include a nitrogen gas, an argon gas, a hydrogen gas, a mixed gas thereof or the like as a plasma generation gas. The gas flow path 140 is provided completely independently of the gas flow path 130 such that the second gas flowing through the gas flow path 140 and the first gas flowing through the gas flow path 130 are not mixed in the shower plate 100.

A plurality of second gas supply holes 151 in communication with the gas flow path 140 is formed to extend vertically upward at positions which are spaced further apart from the outer surface of the drooping member 101 and different from those of the slots 220 in the lower portion of the lower plate 120. The second gas supplied to the gas flow path 140 from the second gas supply source 141 is introduced into the plasma space U of the processing vessel 10 from the lower surface of the lower plate 120 through each of the second gas supply holes 151.

The plurality of slots 220 described above are formed to penetrate through the shower plate 100 in a direction perpendicular to a diametrical direction of the shower plate 100 at positions different from those of the gas flow paths 130 and 140 used as the gas supply paths, the plurality of first gas supply holes 133, the plurality of second gas supply holes 151, and the through-holes 150 and 161. One end of the slot 220 is adjacent to the slow-wave plate 70, and the other end of the slot 220 is opened toward the plasma space U of the processing vessel 10. The microwave is radiated into the processing vessel 10 by propagating through the coaxial tube 60, followed by transmitting through the slow-wave plate 70, followed by being introduced into the plurality of slots 220. In some embodiments, the slot 220 may have a structure in which the inside of the slot 220 is filled with a dielectric such as quartz.

The diameters of the through-hole 160 and the second gas supply hole 151 are determined so that the microwave radiated into the processing vessel 10 is not introduced into the through-hole 160 and the second gas supply hole 151. In this embodiment, the diameter is, for example, 0.6 mm. Also, the slots 220 are completely separated from the first gas supply holes 133, the second gas supply holes 151, and the through-holes 150 and 160 inside the shower plate 100. With this configuration, it is possible to prevent any abnormal discharge from generating in the first gas supply holes 133, the second gas supply holes 151, or the through-holes 150 and 160.

Contact surfaces between the slow-wave plate 70, the upper plate 110 and the lower plate 120 are sealed by O rings (not shown), respectively. With this configuration, it is possible to make the inside of the processing vessel 10 or the slots 220 in a vacuum state, as well as to prevent the first and second gases from being mixed in the shower plate 100.

In some embodiments, a surface exposed to plasma in the shower plate 100, i.e., the lower end surface of the lower plate 120 and a surface of the drooping member 101 may be coated with, for example, a film (not shown) of alumina ($Al_2O_3$) or yttria ($Y_2O_3$) through a thermal spraying. In this way, a conductive surface may not be exposed to the plasma space.

Figure 5:
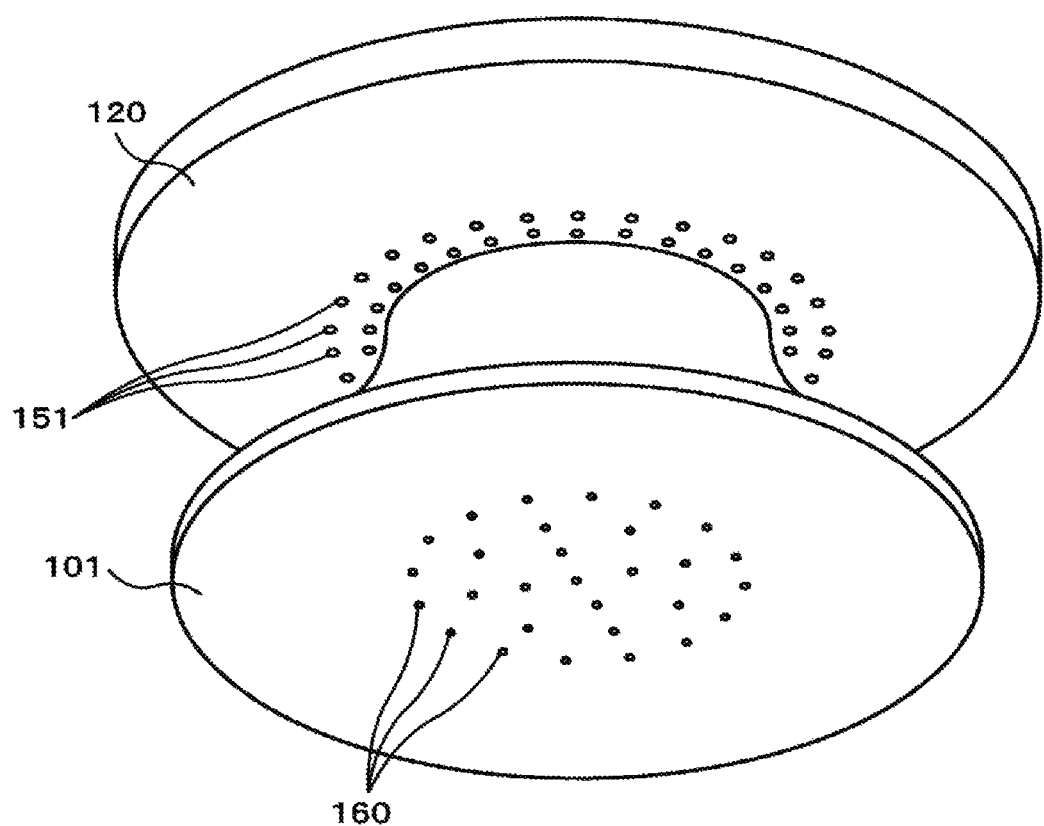
FIG. 5 is an enlarged longitudinal sectional view schematically showing a configuration in the vicinity of a drooping member.

FIG. 5 shows an example of a schematic positional relationship between the drooping member 101, the lower plate 120, the second gas supply holes 151, and the through-holes 160 formed in the drooping member 101, and is a perspective view of the vicinity of the drooping member 101 when obliquely viewed from below. Further, in FIG. 5, the depiction of the slots 220 is omitted. For example, as shown in FIG. 5, the through-holes 160 formed in the drooping member 101 are concentrically arranged with the drooping member 101 in the vicinity of a central portion of the drooping member 101. In addition, as described above, the first gas supply holes 133 and the through-holes 150 are formed at positions corresponding to the through-holes 160, respectively. Therefore, in this embodiment, the first gas supply holes 133 and the through-holes 150 are also concentrically arranged with the drooping member 101 as shown in, e.g., FIG. 5. The second gas supply holes 151, for example, are concentrically arranged with the drooping member 101 at an upper end portion of the drooping member 101. Further, in FIG. 5, the second gas supply holes 151 are arranged in positions which is not visible because they are covered by the drooping member 101 as the drooping member 101 is viewed from below. However, the second gas supply holes 151 are not necessarily arranged in the positions which cannot be visible by the drooping member 101.

Next, a configuration in the vicinity of the shower plate 100 and the drooping member 101 will be described based on the principle of the present disclosure. In a microwave-based plasma process, energy of about 8.75 eV or more is required to decompose, for example, monosilane ($SiH_4$), which is used as a raw material gas when forming a film on the wafer W, into $SiH_3$. Meanwhile, for example, nitrogen gas used as a plasma generation gas has a binding energy of about 9.91 eV. That is to say, energy of about 9.91 eV or more is necessarily applied to generate a nitrogen plasma or nitrogen radicals by exciting the nitrogen gas. Thus, an output of the microwave supplied to the antenna 20 in the microwave-based plasma process is determined based on higher energy, i.e., energy for exciting the plasma generation gas. Here, in a microwave-based plasma process using a metal surface wave (particularly, a surface wave-based plasma process using an evanescent wave), an electron temperature in the vicinity of a lower end surface of the antenna 20, for example, a region spaced apart by about 5 mm or less from a bottom surface of the antenna 20 generally is increased as compared with a region spaced apart by about 5 mm or more from the bottom surface of the antenna 20.

Figure 6:
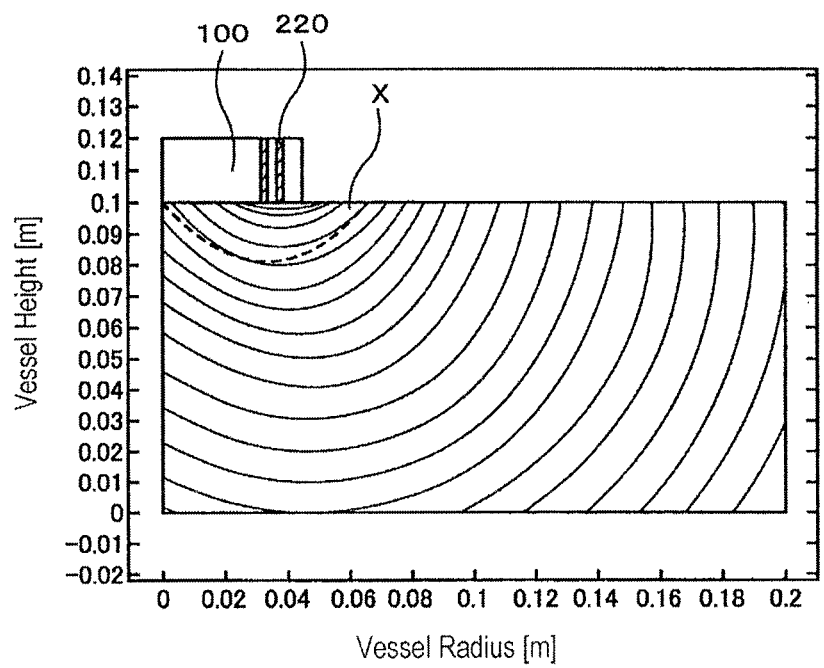
FIG. 6 is an explanation view showing an electron temperature distribution in the vicinity of a conventional shower plate.

The present inventors have performed an examination and have found that the electron temperature was particularly increased in the vicinity of the slot 220 formed in the shower plate 100. FIG. 6 shows an electron temperature distribution in the vicinity of the shower plate 100 having the slot 220 formed at an outer circumferential portion thereof. In FIG. 6, a vertical axis represents a height in the processing vessel 10, and a horizontal axis represents a distance in the horizontal direction from the center axis of the coaxial tube 60. In FIG. 6, there is illustrated the electron temperature distribution when the center of the slot 220 is set to be spaced apart by about 35 mm from the center axis of the coaxial tube 60. Also, a dashed line shown in FIG. 6 is a boundary line where the electron temperature is 1 eV. In FIG. 6, the electron temperature in a region X near to the slot 220 from the dashed line (a region spaced apart by a radius of about 35 mm from the slot 220) is higher than 1 eV, and a region in the vicinity of the slot 220 becomes a region having a high electron temperature. That is to say, the plasma generation gas and the raw material gas are actively ionized in the region X. Therefore, if both the nitrogen gas as the plasma generation gas and the monosilane gas as the raw material gas are supplied from the shower plate as in the conventional technique, the nitrogen gas is decomposed into nitrogen ions, nitrogen atomic radicals, and nitrogen atoms in the region X having a high electron temperature. However, since the energy is not sufficient in a region having a low electron temperature, atomic nitrogen having high reactivity is hardly generated. Meanwhile, since the monosilane gas is decomposed into $SiH_3$ even at the outside of the region X but a large amount of $SiH_2$ and SiH is generated in the region X having the high electron temperature, $SiH_2$ and SiH are excessively generated in the region X so that a silicon film thus formed is deposited in the gas supply holes of the shower plate.

In order to suppress the generation of deposits by a reaction production and a gas phase reaction, the electron temperature in the region X is required to be decreased by lowering the output of the microwave supplied to the antenna 20. However, if the output of the microwave is lowered so as to prevent the excessive generation of $SiH_2$ and SiH, a predetermined electron temperature at which the plasma generation gas is decomposed, is not obtained. Therefore, there is also a limitation in lowering the output of the microwave.

Upon reference to the foregoing, the present inventors made a close study on a method of introducing the raw material gas supplied from the shower plate 100 into the processing vessel 10 without allowing the raw material gas to pass through the region X having a high electron temperature, thus preventing deposits from being deposited in the gas supply holes due to unnecessary reaction production and gas phase reaction. However, if the raw material gas is supplied into the processing vessel 10 through the sidewall of the processing vessel 10 as in the conventional technique, it is difficult to control the flow of gas in the processing vessel 10, and therefore, uniform plasma cannot be obtained.

Thus, the present inventors have noted that, by separately forming the gas flow paths 130 and 140 such that the plasma generation gas and the raw material gas are not mixed inside the shower plate 100, supplying the plasma generation gas into the region X or another region in the vicinity of the region X, and supplying the raw material gas into each place spaced apart from the region X, it is possible to avoid excessive decomposition of the raw material gas, and to efficiently excite the plasma generation gas. Also, the present inventors thought that based on such an idea, for example, the drooping member 101 as shown in FIG. 4 was installed at the lower end of the shower plate 100.

Figure 7:
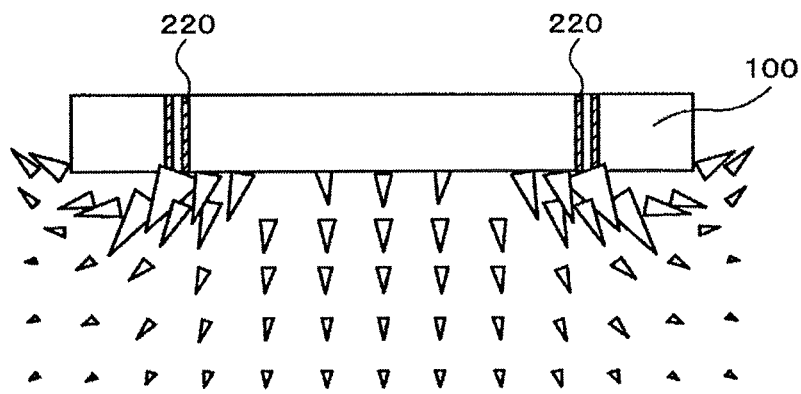
FIG. 7 is an explanation view showing an electric field intensity distribution in the vicinity of the conventional shower plate.
Figure 8:
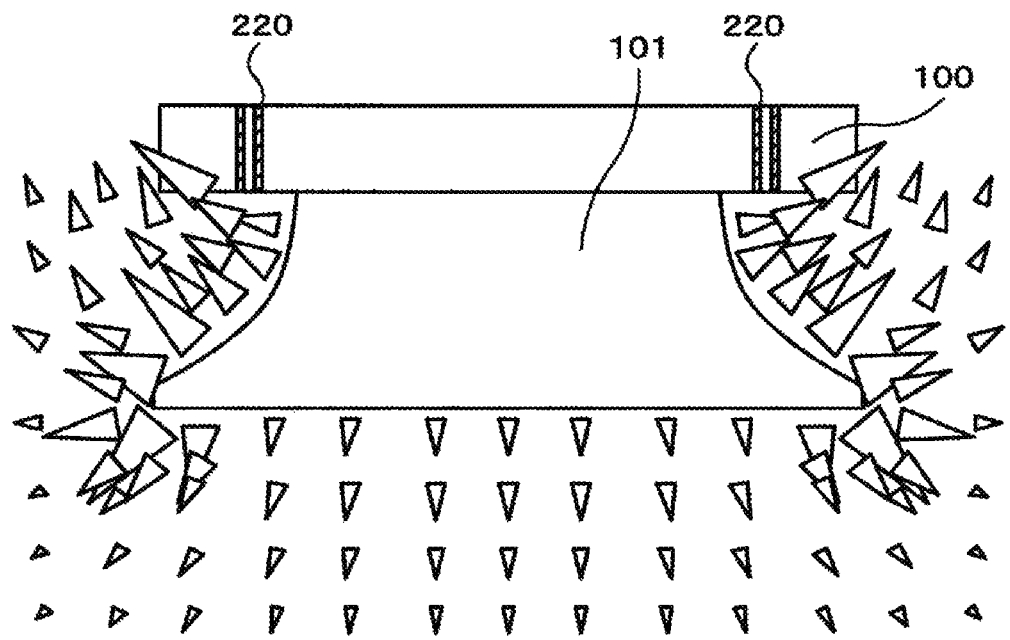
FIG. 8 is an explanation view showing an electric field intensity distribution in the vicinity of a shower plate equipped with the drooping member.

The present inventors first investigated an electric field intensity near the shower plate 100 in installing the drooping member 101 at the lower end of the shower plate 100. FIGS. 7 and 8 show electric field intensity distributions in the vicinity of the shower plate 100 having the slots 220 formed at the outer circumferential portion thereof and electric field directions. While FIG. 7 shows an electric field intensity distribution when only the shower plate 100 is installed, FIG. 8 shows an electric field intensity distribution when the drooping member 101 is installed at the lower end of the shower plate 100. In FIGS. 7 and 8, the size of each of triangles represents the intensity of the electric field, and the direction of the respective triangle represents the direction of the electric field. It was confirmed that the electric field mainly faced downward in the shower plate 100 having the drooping member 101 not installed thereto as shown in FIG. 7, whereas as the drooping member 101 was installed, the electric field intensity in the lateral directions was increased in the vicinity of the outer surface of the drooping member 101 as shown in FIG. 8. From this, it is inferred that the high electron temperature is obtained in the vicinity of the outer surface of the drooping member 101. This is attributed to the fact that since the outer surface of the drooping member 101 spreads outward as it goes from the top end toward the bottom end thereof, a microwave is reflected in a lateral direction or an upwardly inclined direction from the outer surface of the drooping member 101, and therefore, a high-energy state is formed in the vicinity of the outer surface of the drooping member 101.

Figure 9:
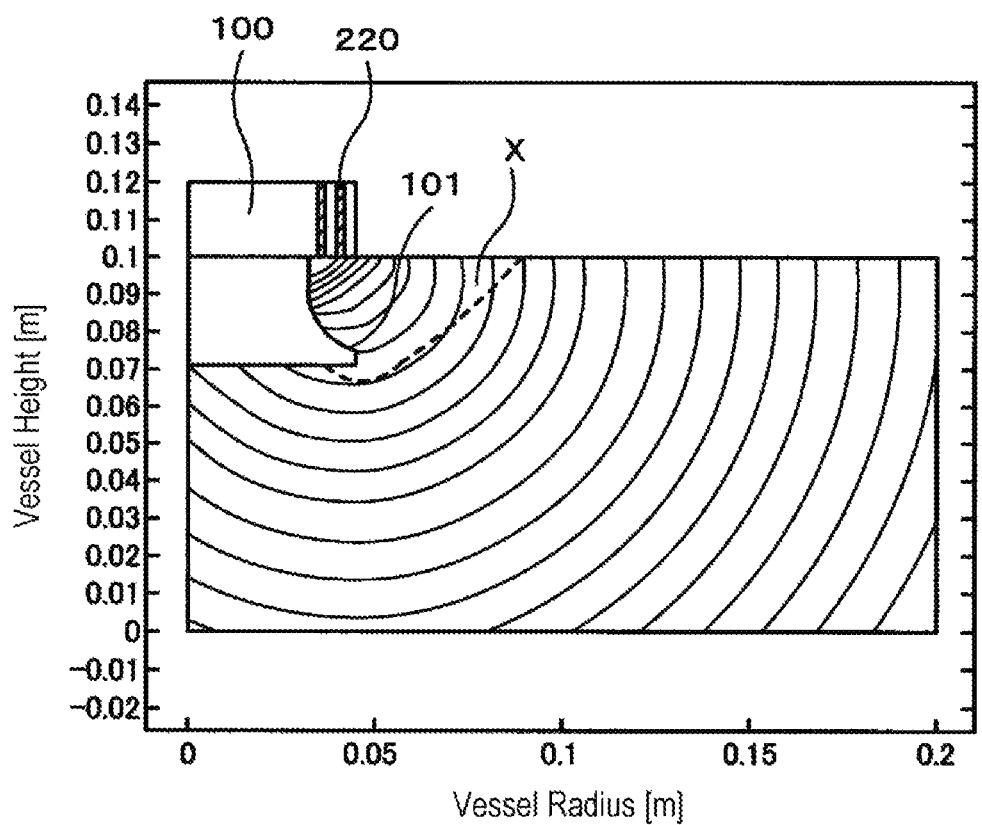
FIG. 9 is an explanation view showing an electron temperature distribution in the vicinity of the shower plate equipped with the drooping member.

Next, FIG. 9 shows an electron temperature distribution in the vicinity of the shower plate 100 when the drooping member 101 is installed to the shower plate 100. In FIG. 9, a distance between the center axis of the coaxial tube 60 and the center of the slot 220 is about 35 mm in the same manner as the case of FIG. 6, and the radius of the bottom surface of the drooping member 101 is about 45 mm. In FIG. 9, it can be seen that as the drooping member 101 is installed, the region X of which the electron temperature is 1 eV or more is distributed in the vicinity of the slot 220 and in the outer surface of the drooping member 101, and the electron temperature is approximately 1 eV or less under the bottom surface of the drooping member 101. From this, it is inferred that as described above, since the outer surface of the drooping member 101 spreads outward as it goes from the top end to the bottom end thereof, a microwave is reflected in a lateral direction or an upwardly inclined direction from the outer surface of the drooping member 101, and therefore, the electric field intensity in the vicinity of the outer surface of the drooping member is increased.

Thus, as shown in FIG. 4, the second gas supply holes 151 are disposed outward of the outer surface of the drooping member 101, and the first gas supply holes 133 and the through-holes 150 and 160 are disposed inward of the outer surface of the drooping member 101. In this state, the plasma generation gas is concentratively supplied into the region X, while an ease-to-decompose raw material gas is introduced into the processing vessel 10 without passing through the region X. This suppresses the raw material gas from being excessively decomposed in the region X, thus suppressing the generation of precursors caused from the raw material gas. Accordingly, it is possible to prevent the through-holes 160 or the second gas supply holes 151 from being clogged.

Figure 10:
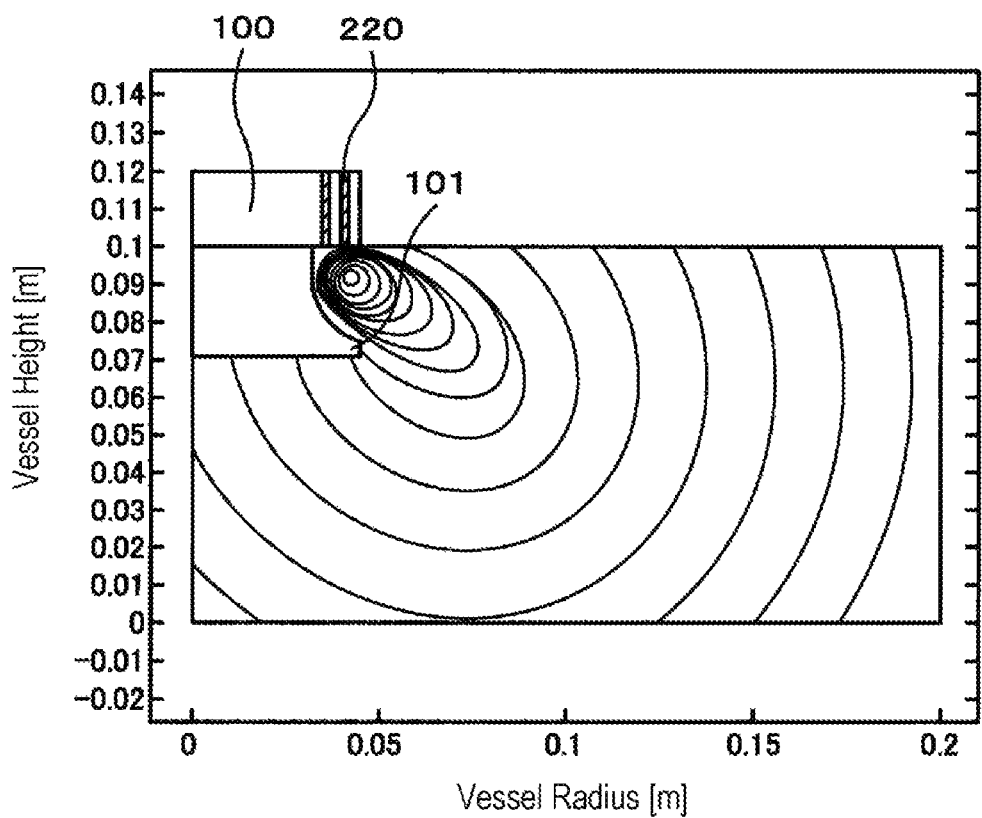
FIG. 10 is an explanation view showing an electron density distribution in the vicinity of the shower plate equipped with the drooping member.

In addition, the present inventors investigated an electron density in the vicinity of the shower plate 100 when the drooping member 101 was installed. As a result, the investigation shows that as shown in FIG. 10, a high-density region is formed in the vicinity of the slot 220 and in the vicinity of the outer surface of the drooping member 101. From this, it can be seen that the region X is in a high-energy state, and the plasma generation gas in the region X is efficiently excited.

Here, as can be seen in FIG. 9, for example, the region X having a high electron temperature is distributed outward from the outer surface of the drooping member 101. For example, when the drooping member is viewed from below, the region X is also distributed at a position outside the bottom surface of the drooping member 101. Therefore, as described above, the second gas supply holes 151 are not necessarily formed in positions which cannot be visible because they are covered by the drooping member 101 when viewed from below, and may be formed at positions facing the region X. The present inventors have also confirmed that when the outer surface of the drooping member 101 is formed in a parabolic shape in which a contact point between the shower plate 100 and the outer surface of the drooping member 101 is set as the origin, for example, as in this embodiment, a region in the vicinity of the focus of the parabolic shape is in a high-energy state. In this case, the second gas supply holes 151 may be formed at positions facing the region in the vicinity of the focus of the parabolic shape.

In addition, the drooping member 101 as a projection is installed to the lower plate 120 and the surface wave propagates through the drooping member 101. This hinders the generation of uniform plasma in the plasma space U. Therefore, the length L of the drooping member 101 may be set to be equal to or smaller than the wavelength of a microwave introduced into the processing vessel 10 at maximum, and in some embodiments, may be set to be equal to or smaller than ½ of the wavelength. The present inventors have found that the length L of the drooping member 101 is set as described above to suppress the propagation of the surface wave through the drooping member 101, thus stably generating plasma in the processing vessel 10. In this embodiment, since a microwave of 860 MHz with a wavelength of 348.6 mm is used, the length L of the drooping member 101 may be set to fall within a range from about 10 to 60 mm, and in some embodiments, a range from 20 to 40 mm.

The plasma processing device 1 according to this embodiment is based on the above-described findings. Next, a case where a silicon nitride film is formed on the wafer W in the process performed using the plasma processing device 1 will be described as an example.

First, the wafer W is loaded into the processing vessel 10 and mounted on the susceptor 11. Then, a gas mixture of a nitrogen gas, an argon gas and a hydrogen gas is introduced as the plasma generation gas into the processing vessel 10 through the lower plate 120 of the shower plate 100 from the second gas supply source 141. Thereafter, a microwave is output from the microwave output part 40 and introduced into the processing vessel 10 through the microwave transmitting mechanism 30, the slow-wave plate 70, and the slots 220. Accordingly, a surface wave plasma is generated by a metal surface wave formed on surfaces of the antenna 20 and the drooping member 101. At this time, since the region X in the vicinity of the outer surface of the drooping member 101 having the slots 220 formed therein is in a high-energy state, the plasma generation gas supplied from the second gas supply holes 151 formed in the vicinity of the outer surface of the drooping member 101 is excited by the high energy in the region X, so that nitrogen radicals are efficiently generated. In addition, a monosilane gas is introduced as a raw material gas into the processing vessel 10 from the first gas supply source 131 through the first gas supply holes 133, and the through-holes 150 and 160.

The monosilane gas introduced into the processing vessel 10 is excited by plasma and decomposed into $SiH_3$. At this time, since the monosilane gas is introduced into the plasma space U of the processing vessel 10 from the bottom surface of the drooping member 101, the monosilane gas does not pass through the region X having the high electron temperature. This suppresses the reaction production and the gas phase reaction from being occurred due to excessive $SiH_3$.

In addition, the nitrogen radicals and $SiH_3$ reach an upper surface of the wafer W along a vertically-downward gas stream toward the wafer W from the shower plate 100 and are deposited as a silicon nitride on the surface of the wafer W. Thus, a silicon nitride film is formed on the upper surface of the wafer W.

According to the above embodiments, since the first gas supply holes 133 are formed inward of the outer surface of the drooping member 101, the first gas does not pass through the region X, in which the electron temperature is high, in the vicinity of the slots 220 formed in the shower plate 100. Thus, it is possible to prevent the monosilane gas from being excessively decomposed by the surface wave plasma. As a result, when a plasma process is performed on the wafer W using the shower plate 100, it is possible to prevent deposits caused from the reaction production and the gas phase reaction, i.e., the silicon film in this embodiment, from being formed in gas holes such as the through-holes 160 or the second gas supply holes 151 of the shower plate 100.

In addition, since the outer surface of the drooping member 101 has a parabolic shape, and the shape of the drooping member 101 and the arrangement of the slots 220 are set so that imaginary lines drawn vertically downward from the centers of the slots 220 respectively intersect the parabolic shape, the microwave is reflected in a lateral direction or an upwardly inclined direction from the outer surface of the drooping portion 101. Accordingly, the electric field intensity in the vicinity of the outer surface of the drooping member 101 is increased, and the region X in the high-energy state is formed in the vicinity of the outer surface of the drooping member 101. As a result, the second gas supplied from the second gas supply holes 151 is efficiently excited in the region X, so that plasma can be efficiently generated. Also, the positional relationship between the slots 220 and the drooping member 101 is not necessarily limited to this embodiment. Although the slots 220 are positioned outside the parabolic shape of the outer surface of the drooping member 101, since the microwave introduced from the slots 220 is reflected by the outer surface of the drooping member 101, a region having a high electric field intensity can be formed in the vicinity of the outer surface of the drooping member 101.

According to this embodiment, the drooping member 101 is installed at the bottom surface of the shower plate 100, so that for example as shown in FIG. 8, the electric field intensity in the lateral direction is increased in the vicinity of the outer surface of the drooping member 101. Here, in the conventional shower plate having the drooping member 101 not installed thereto, for example, as shown in FIG. 7, the expansion of the electric field in the lateral direction from the shower plate was not large, and the electric field intensity of a region corresponding to the lower position of the coaxial tube 60 tended to be relatively higher than those of the other regions. As a result, the electric field intensity in the processing vessel became non-uniform, and therefore, there was a limitation in performing a uniform plasma process. In this respect, as the drooping member 101 is installed according to this embodiment, the electric field intensity can be increased, thereby uniformizing the electric field intensity distribution as compared with the conventional technique. Thus, according to the plasma processing device 1 of this embodiment, it is possible to perform a plasma process having a higher uniformity than the conventional technique.

Since a temperature in the vicinity of the bottom surface of the lower plate 120 is high by the surface wave plasma, a temperature of the gas flowing through the gas flow paths 140 is also increased by heat of the plasma. As a result, an internal energy of the gas in the gas flow paths 140 increases and therefore the gas is changed to an easy-to-decompose gas. Thus, if a hard-to-decompose gas, i.e., the plasma generation gas in this embodiment, flows through the gas flow paths 140, the decomposition of the gas by the surface wave plasma can be accelerated. Therefore, the second gas supply source 141 configured to supply the plasma generation gas is preferably connected to the gas flow paths 140 of the lower plate 120.

Figure 11:
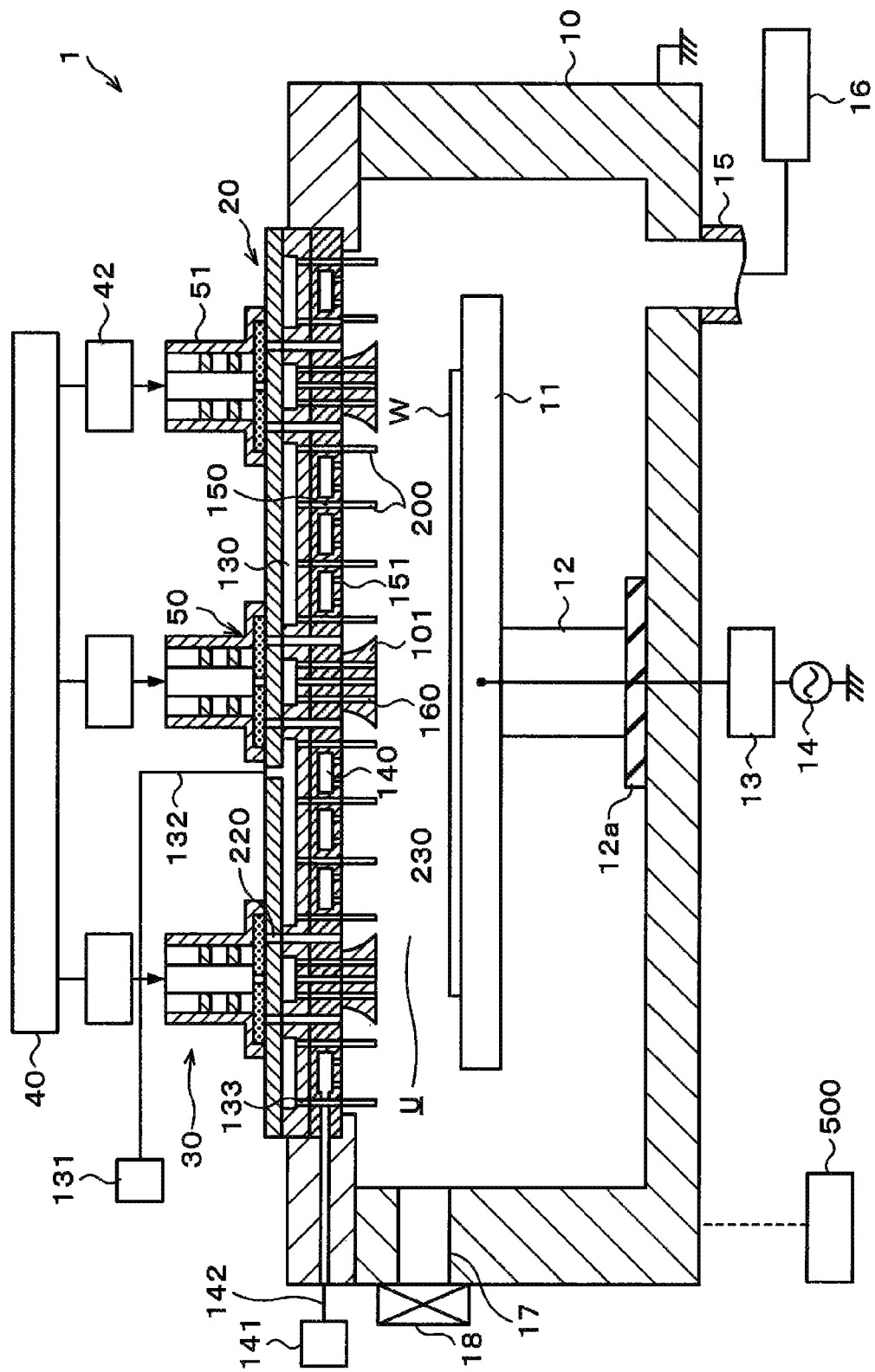
FIG. 11 is a longitudinal sectional view schematically showing a configuration of a plasma processing device according to another embodiment of the present disclosure.

While in the above embodiments, the first gas supply holes 133 has been described to be formed at only positions corresponding to the drooping member 101, the first gas supply holes 133 may be formed at other positions in the drooping member 101. In some embodiments, as shown in FIG. 11, the second gas supply holes 151 and the first gas supply holes 133 may be disposed at approximately regular intervals in the bottom surface of the shower plate 100. Also, the through-holes 150 are formed at positions corresponding to the first gas supply holes 133 of the lower plate 120. In this case, when the first gas used as the raw material gas passes through a region having a high electron temperature in the vicinity of the bottom surface of the lower plate 120, supply nozzles 200 having a predetermined length may be respectively provided at lower ends of the through-holes 150 such that a deposit caused from the reaction production and the gas phase reaction is prevented from clogging the gas holes such as the second gas supply holes 151 or the through-holes 150. Although in FIG. 11, the length of each of the supply nozzles 200 has been shown to be equal to the length L of the drooping member 101, the present disclosure is not limited thereto. In some embodiments, the length of each of the supply nozzles 200 may be arbitrarily set as long as the supply nozzles 200 pass through a region having a relatively high electron temperature, e.g., the region spaced apart by about 5 mm or less from the bottom surface of the shower plate 100 as described above. As the supply nozzles 200 used as projections are provided, the surface wave also propagates through the supply nozzles 200 to generate resonance. This may hinder the generation of uniform plasma in the plasma space U. Thus, in some embodiments, the length of the supply nozzle 200 may be set to about $\frac{1}{16}$ to $\frac{3}{16}$ of the wavelength of the microwave introduced into the processing vessel 10, and especially, about $\frac{1}{8}$.

Figure 12:
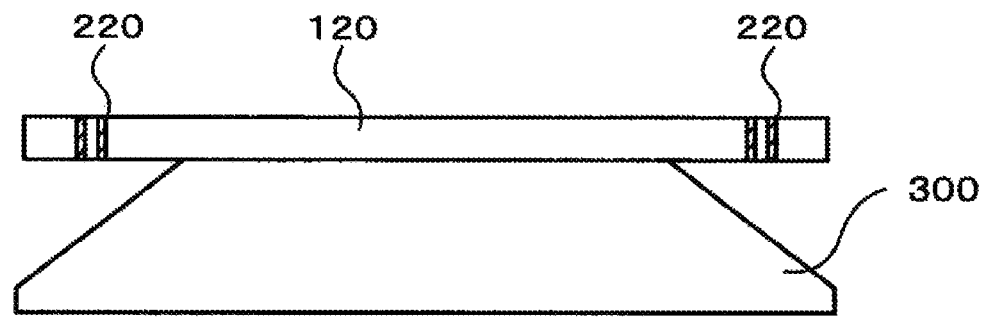
FIG. 12 is a side view schematically showing a configuration of a drooping member according to another embodiment of the present disclosure.
Figure 13:
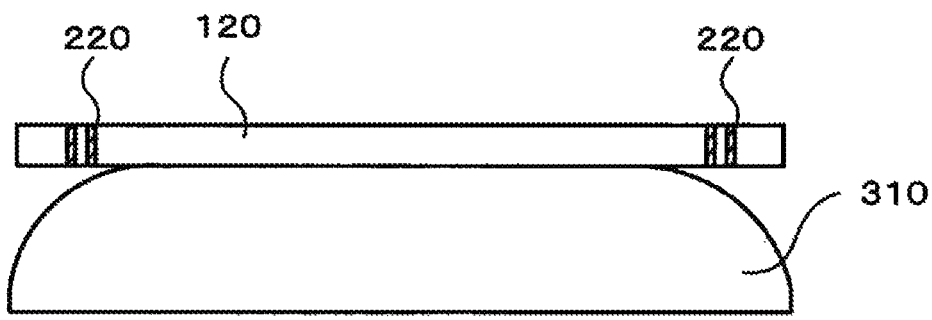
FIG. 13 is a side view schematically showing a configuration of a drooping member according to another embodiment of the present disclosure.

While in the above embodiments, the outer surface of the drooping member 101 has been described to have the parabolic shape, the present disclosure is not limited thereto. In some embodiments, the outer surface of the drooping member 101 may be arbitrarily set as long as it spreads outward as it goes from the top end to the bottom end thereof. As an example, as shown in FIG. 12, a drooping member 300 having an approximately truncated cone shape, of which the outer surface is formed in a line shape, may be used. Alternatively, as shown in FIG. 13, a drooping member 310 having an approximately secondary curved shape in which a tangential direction of an outer surface thereof is gradually changed from an inclined direction to a vertical direction, may be used. According to the present disclosure, if the outer surface of the drooping member 101 has a shape spreading outward as it goes from the top end to the bottom end thereof, since the microwave is reflected in a lateral direction or an upwardly inclined direction from the outer surface of the drooping member 101, a high-energy state may be formed in the vicinity of the outer surface of the drooping member 101.

Figure 14:
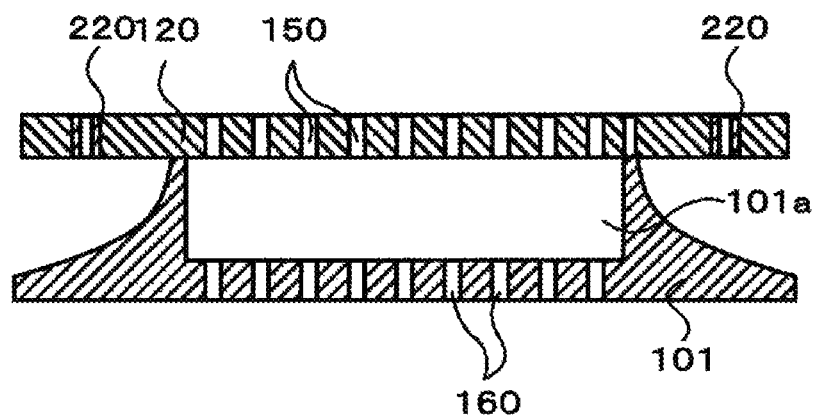
FIG. 14 is a longitudinal sectional view schematically showing a configuration of a drooping member according to another embodiment of the present disclosure.

Although in the above embodiments, the through-holes 160 vertically penetrating through the drooping member 101 has been described to be formed inside the drooping member 101, the through-holes 160 may extend in, e.g., an inclined direction. Further, in some embodiments, the shape of each of the through-holes 161 may be arbitrarily set as long as they are formed at a position not facing the region X such that, for example, a raw material gas such as a monosilane gas is not excessively decomposed. Further, in some embodiments, as shown in FIG. 14, a gas chamber 101*a* in communication with the through-holes 150 of the lower plate 120 may be formed inside the drooping member 101, and through-holes 160 may be formed below the gas chamber 101*a*.

While in the above embodiments, the plurality of through-holes 160 has been described to be formed in the vicinity of the central portion of the drooping member 101, and the first gas supply holes 133 has been described to be formed at positions corresponding to the through-holes 161, respectively, the present disclosure is not limited thereto. In some embodiments, from the standpoint of suppressing the monosilane gas as the raw material gas from being excessively decomposed, if a region at which electric field intensity is weak or at which electron temperature is low exists in the bottom surface of the drooping member 101, the through-holes 160 may be formed in only a region with such a low electric field intensity or low electron temperature.

From the inventors' investigation about these respects, it was confirmed that a region at which electric field intensity concentrically became weak existed at, e.g., a predetermined position in the bottom surface of the drooping member 101. The present inventors have found that the region at which electric field intensity becomes weak, as will be described later, exists at positions corresponding to minimum values of a Bessel function obtained as solutions of a Bessel equation which represent an electric field intensity distribution in the bottom surface of the drooping member 101. Hereinafter, the region at which electric field intensity becomes weak will be described.

First, the present inventors measured an electric field intensity distribution in the bottom surface of the drooping member 101 using a Langmuir probe and a spectrum analyzer. Specifically, the Langmuir probe (not shown) connected to the spectrum analyzer (not shown) was inserted into the processing vessel 10 from the outside thereof, to scan positions spaced apart by 10 mm downward from the lower end surface of the drooping member 101 along a diameter direction of the bottom surface of the drooping member 101. At this time, a microwave of 860 MHz was supplied from the microwave oscillator 42. The radius of the drooping member 101 was about 45 mm. The result is shown in FIG. 15. In FIG. 15, a horizontal axis represents a position in a radial direction of the drooping member 101, and a vertical axis represents an electric field intensity.

According to the electric field intensity distribution shown in FIG. 15, it can be seen that a point at which electric field intensity becomes minimum exists at a position spaced apart by about 20 mm from the center of the bottom surface of the drooping member 101. Also, a peak was observed at 860 MHz as a measurement result of the spectrum analyzer. From this point, it can be seen that when the microwave is introduced into the processing vessel 10, a region at which electric field intensity is low as compared with other regions is formed at positions on the circumference of a circle having a radius of 20 mm from the center of the drooping member 101 in the bottom surface of the drooping member 101.

In addition, the present inventors made further studies on a reason why such an electric field intensity distribution is generated in the bottom surface of the drooping member 101, and have found that the electric field intensity distribution corresponds to a Bessel function obtained as solutions of the Bessel equation which represent the electric field intensity distribution in the bottom surface of the drooping member 101. Hereinafter, a method of obtaining the Bessel function as solutions of the Bessel equation representing an electric field intensity distribution will be described.

The present inventors have thought that a surface wave propagating through the bottom surface of the drooping member 101 is established as a model of a cylindrical coordinate system as shown in FIG. 16. Specifically, a disc-shaped dielectric 251 having a predetermined thickness d is disposed vertically downward from a lower surface (bottom surface) 250 of the drooping member 101, which is made of a metal, and a plasma 252 is formed on a bottom surface of the dielectric 251. Here, a radius of the cylindrical coordinate system is a. The dielectric 251 is a plasma sheath formed under the drooping member 101, and a specific permittivity of the dielectric 251 is 1. When the surface wave is expressed using the cylindrical coordinate system as shown in FIG. 16, a Maxwell equation representing the surface wave, for example, may be represented by the Bessel equation as shown in FIG. 17. In the equation shown in FIG. 17, $E_z$ is the electric field intensity in a vertical direction, r is a coordinate in a radial direction, and k and β are wave numbers of the microwave.

In the model shown in FIG. 16, since an outer circumferential end portion of the drooping member 101 is opened, if the equation of FIG. 17 is solved with an end portion of the plasma sheath, i.e., an end portion of the dielectric 251, as an open end, then a Bessel function is obtained as solutions of the Bessel equation as shown in FIG. 18.

In addition, a theoretical value of the electric field intensity distribution in the bottom surface of the drooping member 101 having a radius of 45 mm is obtained by the Bessel function, thereby obtaining a distribution as indicated by a dashed line in FIG. 19, for example. In FIG. 19, a horizontal axis represents a position in a radial direction of the drooping member 101, and a vertical axis represents the electric field intensity. Also, a solid line in FIG. 19 indicates the actually-measured electric field intensity distribution shown in FIG. 15.

As shown in FIG. 19, it can be seen that the electric field intensity distribution represented by the function of FIG. 18 has a minimum point at a position in the vicinity of a radius of about 20 mm and is substantially matched to the actually-measured data of the electric field intensity distribution shown in FIG. 15. From this result, it can be seen that the electric field intensity distribution in the bottom surface of the drooping member 101 according to this embodiment is obtained by the Bessel function obtained as the solutions of the Bessel equation.

The electric field intensity distribution in the bottom surface of the drooping member 101 becomes minimum values on the circumference of a circle having a predetermined radius, e.g., a radius of about 20 mm in this embodiment. Therefore, as described above, the through-holes 160 in the bottom surface of the drooping member 101 and the first gas supply holes 133 corresponding to the through-holes 160 may be formed at positions corresponding to the minimum values of the Bessel function. With this configuration, it is possible to introduce the raw material gas into the processing vessel 10 by passing through a region in the bottom surface of the drooping member 101, at which electric field is lower, while bypassing the region X. As a result, it is possible to efficiently suppress the monosilane gas as the raw material gas from being excessively decomposed. In addition, the through-holes 160 are formed at positions obtained by considering the minimum values, so that it is possible to relatively shorten the protruding length L of the drooping member 101, as compared with when the minimum values are not considered. This reduces a volume of the processing vessel 10, thereby saving a space. In addition, it is possible to reduce the time required to vacuum-exhaust the inside of the processing vessel 10, thereby improving throughput in process.

In addition, from the standpoint of introducing the raw material gas into the processing vessel 10 without allowing the raw material gas to pass through the region X, the drooping member 101 may not have a structure in which the first gas as the raw material gas passes through the inside thereof. As an example, the first gas may be supplied inward of an inner surface of the drooping member 101 using, for example, an annular drooping member which is hollow.

Figure 20:
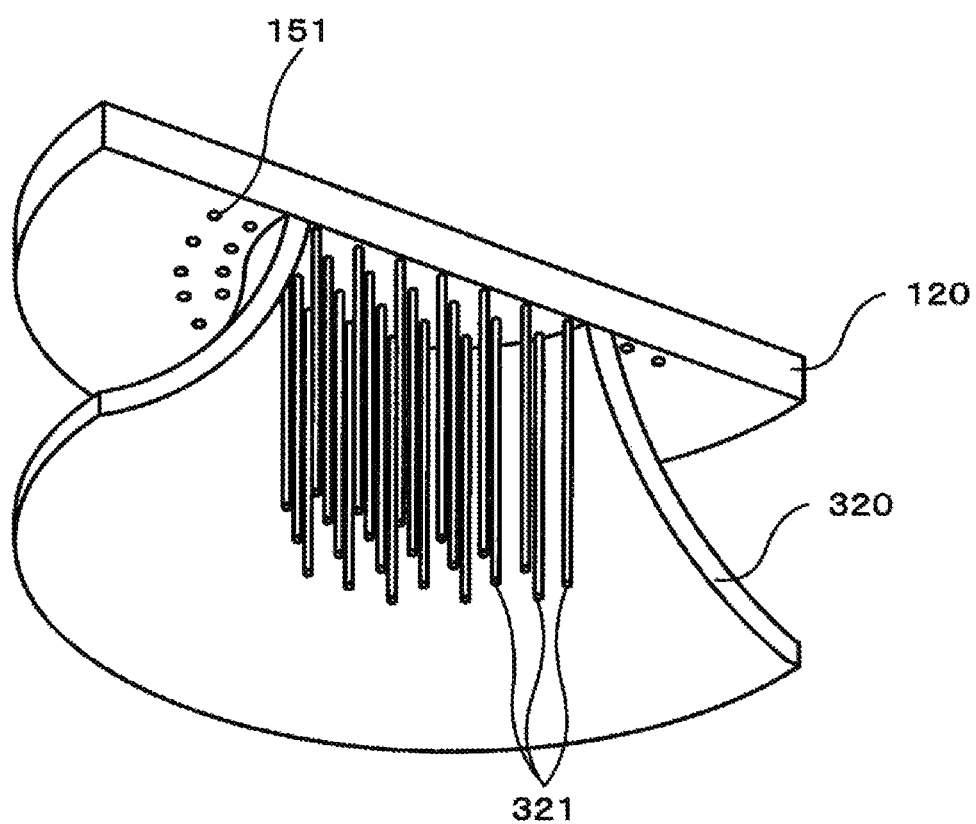
FIG. 20 is an explanation view schematically showing a configuration of a drooping member according to another embodiment of the present disclosure.

Specifically, for example, as shown in FIG. 20, a substantially circular ring-shaped drooping member 320 at which upper and lower ends are opened and at which diameter is gradually increased toward a lower direction, is installed to the bottom surface of the lower plate 120. In this case, supply nozzles 321 extending vertically downward by a predetermined length may be installed at lower ends of the respective through-holes 150 of the lower plate 120. With this configuration, it is possible to introduce the raw material gas into the processing vessel 10 through the supply nozzles 321 without passing through a region, at which electron temperature is relatively high, spaced apart by about 5 mm or less from the bottom surface of the shower plate 100. Although in FIG. 20, the length of the supply nozzle 321 has been shown to be equal to the length L of the drooping member 320, the length of the supply nozzle 321 may be determined in the same manner as the supply nozzle 200 described above.

While in the above embodiments, the gas flow path 130 of the upper plate 110 and the gas flow path 140 of the lower plate 120 are coupled to the first gas supply source 131 and the second gas supply source 141 through the single supply pipe 132 and the single supply pipe 142, respectively, the present disclosure is not limited thereto. As an example, the gas flow path 130 and the gas flow path 140 may be configured as ring-shaped concentric circular flow paths independent of each other, respectively. Further, in some embodiments, a plurality of supply pipes 132 and a plurality of supply pipes 142 may be installed to the respective gas flow paths 130 and 140, so that a flow rate of the gas supplied to the respective flow path is controlled. By doing so, the supply amount of gas can be controlled in every region of the lower plate 120. For example, the supply amount of the raw material gas or the plasma generation gas can be controlled corresponding to an electric field intensity distribution, thereby performing a more uniform plasma process on the wafer W.

Particularly, when a monosilane gas used as the raw material gas is supplied into the processing vessel 10 using the shower plate 100 having the drooping member 101 not installed thereto as in the conventional technique, the raw material gas is excessively decomposed in the vicinity of the bottom surface of the shower plate 100, and hence it is difficult to control the amount of produced $SiH_3$. However, in the present disclosure, the monosilane gas is supplied through the drooping member 101, so that $SiH_3$ can be prevented from being excessively produced. Thus, the amount of produced $SiH_3$ can be easily adjusted by controlling the supply amount of the monosilane gas. Accordingly, it is possible to control a thickness of a film formed on the wafer W. In this case, the supply amount of gas is controlled in every region of the lower plate 120 by installing the plurality of supply pipes 132 and the plurality of supply pipes 142, so that the amount of produced nitrogen radicals and $SiH_3$ can be further strictly adjusted in each region. This enables a more uniform plasma process on the wafer W.

While in the above embodiments, the shower plate 100 has been described to be configured with the upper plate 110 and the lower plate 120, the configuration of the shower plate 100 is not limited to these embodiments and may be arbitrarily set as long as the shower plate 100 is configured such that the gas flow path 130 of the first gas and the gas flow path 140 of the second gas are independently formed and the gases are not mixed inside the shower plate 100.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

EXPLANATION OF REFERENCE NUMERALS

1: Plasma processing device
10: Processing vessel
11: Susceptor
12: Supporting member
13: Matcher
14: High-frequency power source
30: Microwave transmitting mechanism
40: Microwave output part
50: Antenna module
100: Shower plate
101: Dropping member
110: Upper plate
120: Lower plate
130: Gas flow path
133: First gas supply hole
140: Gas flow path
151: Second gas supply hole
220: Slot
500: Control part
U: Plasma space
W: Wafer
X: Region

What is claimed is:

1. A plasma processing device that processes a substrate by generating a plasma using a surface wave formed on a surface of a shower plate by a supplied microwave, the plasma processing device including a plasma generating antenna which is provided with the shower plate configured to supply a first gas and a second gas into a processing vessel, the plasma processing device comprising:

a protrusion member made of a conductor and installed on the shower plate to protrude downward from a lower end surface of the shower plate, the protrusion member having a truncated conical shape, wherein the truncated conical shape of the protrusion member is defined by an upper end surface, a lower end surface and a lateral surface extending between the upper end surface and the lower end surface, a diameter of the lower end surface being larger than a diameter of the upper end surface, the lateral surface being inclined such that the supplied microwave is reflected from the lateral surface in a lateral direction and an upwardly inclined direction and the lateral surface having a parabolic shape spreading outward from the upper end surface to the lower end surface, wherein the shower plate includes a plurality of first gas supply holes through which the first gas is supplied into the processing vessel and a plurality of second gas supply holes through which the second gas is supplied into the processing vessel, wherein the upper end surface of the protrusion member is in contact with a lower end surface of the shower plate;

through-holes extending from the upper end surface of the protrusion member to the lower end surface of the protrusion member are formed in the protrusion member; and the first gas supply holes are connected to the through-holes, wherein the second gas supply holes are disposed on the lower end surface of the shower plate to surround a portion of the lower end surface of the shower plate being in contact with the upper end surface of the protrusion member, and wherein the through-holes of the protrusion member are formed at positions corresponding to minimum values of an electric field intensity distribution on a circumference of a circle having a predetermined radius in the lower end surface of the protrusion member, which are obtained by a Bessel function as solutions of a Bessel equation for the minimum values of the electric field intensity distribution.

2. The plasma processing device of claim 1, wherein the protrusion member is formed in an annular shape, and
wherein the first gas supply holes are disposed inward of an inner surface of the protrusion member.

3. The plasma processing device of claim 2, wherein a plurality of supply nozzles configured to protrude vertically downward from a bottom surface of the shower plate is connected to the first gas supply holes, respectively.

4. The plasma processing device of claim 1, wherein the first gas is a gas that is more easily decomposed than the second gas.

5. The plasma processing device of claim 4, wherein the first gas is a raw material gas and the second gas is a plasma generation gas.

6. The plasma processing device of claim 1, wherein a microwave radiation hole through which the microwave is radiated into the processing vessel is formed in the shower plate, and
wherein the microwave radiation hole is disposed inward of an outer circumferential end portion of the protrusion member as viewed from the top.

* * * * *